United States Patent [19]

Monticelli et al.

[11] 4,259,643
[45] Mar. 31, 1981

[54] CURRENT GAIN AMPLIFIER CELL

[75] Inventors: Dennis M. Monticelli, Fremont; Peter Lefferts, San Martin, both of Calif.

[73] Assignee: National Semiconductor Corporation, Santa Clara, Calif.

[21] Appl. No.: 6,418

[22] Filed: Jan. 25, 1979

[51] Int. Cl.³ .......................... H03F 3/04; H03F 3/08
[52] U.S. Cl. ................................. 330/288; 330/293; 330/308; 330/311
[58] Field of Search ................ 330/59, 288, 293, 311, 330/308; 307/299 B

[56] References Cited

U.S. PATENT DOCUMENTS 3,822,387  7/1974  Mulder ............................ 307/299 B Primary Examiner—James B. Mullins
Attorney, Agent, or Firm—Gail W. Woodward; James A. Sheridan

[57] ABSTRACT

A three terminal current gain cell is made up of a three-stage common emitter high gain amplifier configuration using complementary transistors. A controlled percentage of the output is coupled back to the input to provide negative feedback. The emitters of the complementary devices are coupled to the appropriate terminals that comprise the cell output. One of the devices employs a dual ratioed collector with the smaller of the two collectors being made to track the input current due to the feedback condition. Thus, the current gain of the cell is determined by a geometric ratio. The gain can be further multiplied by employing additional ratioed devices within the cell or by cell cascading. In one application, the current gain cell is combined with a photo sensor providing the input current. This produces a two terminal device that passes a current linearly related only to the illumination level over a very large range of illumination and other ambient conditions.

5 Claims, 6 Drawing Figures

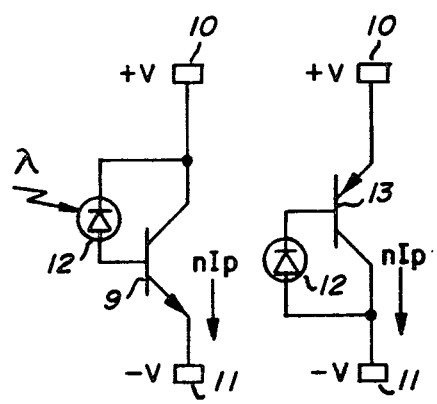
Fig_1 (PRIOR ART)
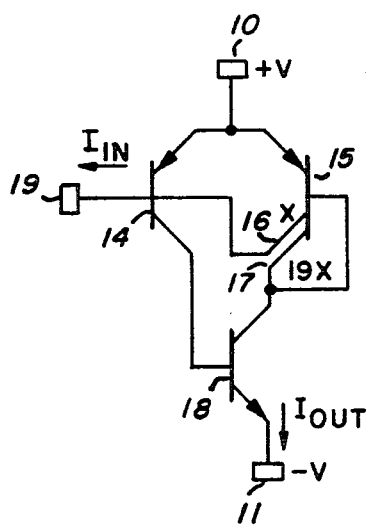
Fig_2
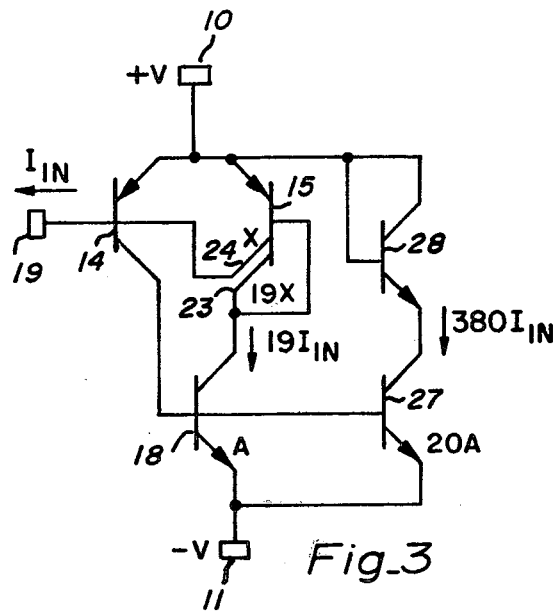
Fig_3
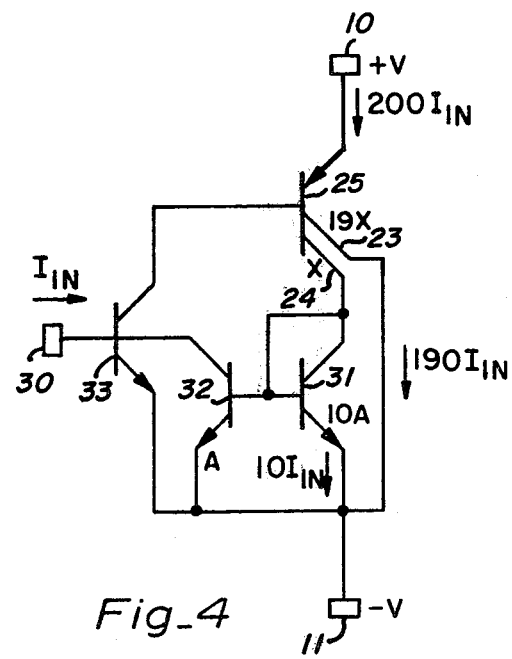
Fig_4

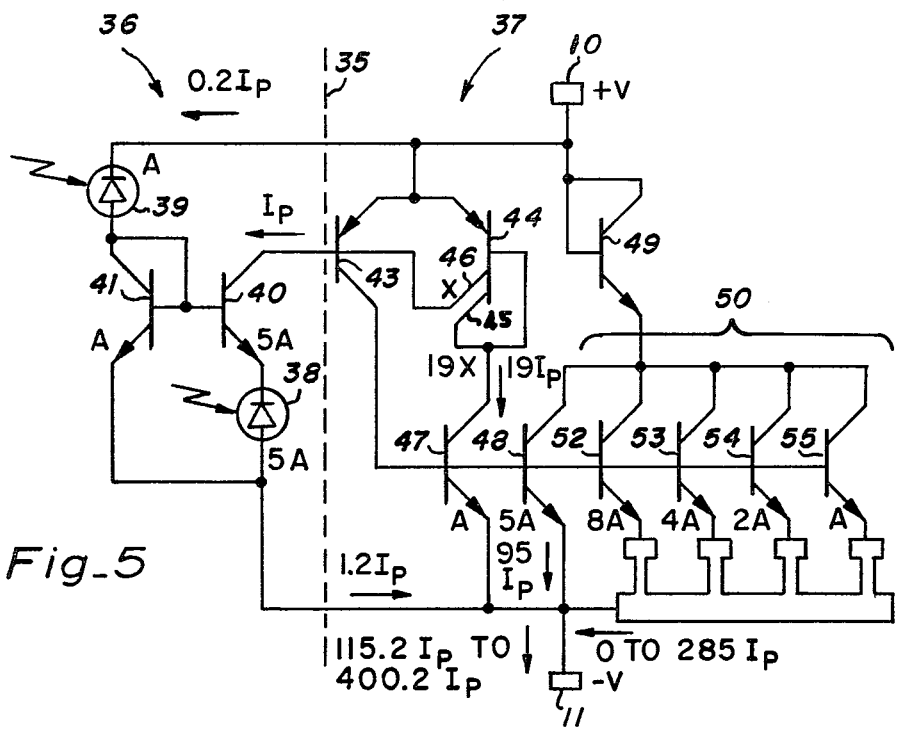
Fig_5
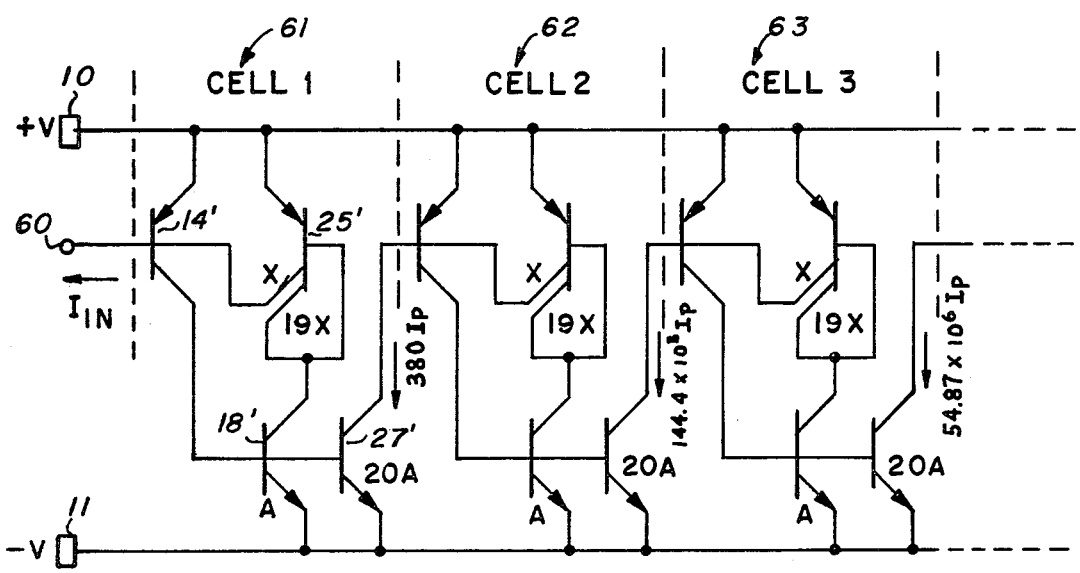
Fig_6

CURRENT GAIN AMPLIFIER CELL

BACKGROUND OF THE INVENTION

The invention relates to a current amplifier primarily intended for use in integrated circuits. In one application, the current amplifier has proven useful in photo current handling circuitry. In photo sensor applications it has been found that silicon integrated circuit (IC) fabrication readily admits of including photodiodes directly on the IC chip. Silicon photo response is readily adaptable to photographic applications and is extremely linear over a very wide range of light levels. Reasonable sized photo dectectors can respond linearly over the six order of magnitude of light ranging from sunlight to dim room lighting. However, the low light levels may result in picoampere photo currents which require special biasing and control circuitry. U.S. Pat. No. 4,118,621 which was issued Oct. 3, 1978 to Dennis M. Monticelli and Robert S. Sleeth, relates to a Photo Electrically Biased Photodiode Operational Amplifier. Here, two photodiodes having ratioed areas are incorporated into a single IC. The sensor photodiode is zero biased at low light levels to reduce leakage currents that, if uncontrolled, could mask the light-related current. The current amplifier used, although offering high gain, high linearity, and wide dynamic range, requires a third terminal for the power supply.

In the prior art FIG. 1), the photo current sensor is coupled to a single transistor for current amplification. This circuit configuration yields two-terminal operation, a desirable feature. Unfortunately, it also suffers from numerous disadvantages, inasmuch as the current multiplication factor is equal to the DC current gain (Beta) of the transistor. The current multiplication factor is loosely controlled in fabrication resulting in a wide variation (nominally 3:1) in current gain. The current multiplication factor is also dependent upon temperature, voltage bias, and current level. The latter manifests as non-linearity of output vs input for a wide range of input current levels.

SUMMARY OF THE INVENTION

It is an object of the invention to provide a current amplifier capable of precise current gain over a very wide range of current values.

It is a further object of the invention to provide a wide range current amplifier capable of high gain independent of operating current, voltage, and temperature.

It is a still further object of the invention to provide a current amplifier capable of operating in conjunction with a photo sensor as a two terminal device.

These and other objects are achieved using a circuit arranged as follows. A dual collector transistor is ratioed to provide substantially different collector currents. The high current collector is coupled back to the base so that a dual ratioed current source is present. The free collector is coupled to the base of a separate current source transistor and also comprises the circuit input terminal. The collector of the separate source transistor is coupled to the base of a current sink transistor, the collector of which is coupled to the base of the dual collector transistor. The two current source transistors in conjunction with the current sink transistor comprise a high gain three stage amplifier with accurately controlled current negative feedback. The operating conditions will self stabilize to ensure that the total current is equal to the input current times the dual transitor collector ratio plus one. If the current sink transistor has its base coupled to a second current sink transistor, a current mirror is obtained. If the second current sink transistor is ratioed to be larger than the first, the circuit current gain can be multiplied by this ratio. Thus, a highly stable current amplifier is available having substantial gain determined solely by geometrical or area considerations.

By the inclusion of additional elements in the circuit, the current gain can be programmed. If desired, a plurality of such current gain cells can be cascaded to achieve virtually any desired overall gain.

BRIEF DESCRIPTION OF THE DRAWING

FIG. 1 is a schematic diagram of a prior art light sensor;

FIG. 2 is a schematic diagram of one current amplifier of the invention;

FIG. 3 is a schematic diagram of a high gain current amplifier;

FIG. 4 is a schematic diagram of a circuit that is the complement of FIGS. 2 and 3;

FIG. 5 is a schematic diagram of a two terminal photo detector having programmable gain; and, FIG. 6 is a schematic diagram of a current amplifier using a plurality of gain cells.

DESCRIPTION OF THE INVENTION

FIG. 1 shows complementary versions of a two terminal light to current converter as commonly used in the prior art. Terminals 10 and 11 constitute the circuit connection points. When a suitable potential is present across terminals 10 and 11, as indicated by $+V$ and $-V$, the current flowing will be proportional to the light impinging on photodiode 12. The photo current, Ip, is amplified in NPN transistor 9 or PNP transistor 13 to produce n·Ip where n is the transistor current gain. The total current flow will be Ip (n+1). Since the current gain (or Beta) of a typical transistor is a function of current over the extended range expected for Ip, the circuit is not linear. Furthermore, the current gain of such a transistor is a function of the manufacturing process, operating temperature, and supply voltage which make the circuit of FIG. 1 related to factors other than light input. If desired, the photodiode can be incorporated directly into the transistor structure to create a photo transistor.

FIG. 2 illustrates the basic circuit of the invention. When terminal 10 is positively biased with respect to terminal 11 by at least one transistor $V_{BE}+V_{SAT}$, a current $I_{OUT}$ will flow at terminal 11 as a function of $I_{IN}$ at terminal 19. $I_{OUT}$ will be virtually independent of higher applied voltages. Transistors 14 and 15 are typically of lateral construction normally associated with current source devices. Transistor 15 has dual ratioed collectors 16 and 17 labeled X an 19X, respectively. The 19 to 1 ratio is selected because it is a relatively large value that can be achieved in IC construction. The base of transistor 15 is coupled to the larger collector 17 and to the collector of an NPN current sink transistor 18. The three transistors are connected together to consititute a three-stage common-emitter amplifier with its output connected to its input. The odd number of stages make the feedback negative. It can be seen that transistors 18 and 14 are common emitter connected and such a cascade produces very high gain. However, transistor 15, having the larger collector coupled to its base, will have a fractional current gain in the three-stage feedback configuration. In effect, transistor 15 acts as a precision nineteen to one attenuator. The three-stage cascade still has high open loop gain due to transistors 14 and 18. The transistor emitters are coupled to terminals 10 and 11 as shown to provide the operating bias for the complementary devices. Terminal 19 comprises the circuit input or current flow control terminal.

The input current $I_{IN}$ will be pulled out of terminal 19 via an input current sink (not shown) and this current will flow substantially in collector 16. Since collector 17 is nineteen times as large, $19 I_{IN}$ will flow in collector 17 and therefore, in the collector of transistor 18. Thus, the current flowing between terminals 10 and 11 will be $19 I_{IN}$, not including the small base currents of transistors 14, 15, and 18. A more accurate, though not exact, expression for the current gain for any collector ratio, n, is given by equation 1.

$$\frac{I_{out}}{I_{in}} \, n \, \frac{n+1}{B15} + \frac{n}{B18} - \frac{n^2}{B18 \, B14} \qquad (1)$$

where the B numbers refer to the transistors designations. The error terms in the brackets are greatly reduced by the open loop DC current gain (Beta) of the transistors. For B14=B15=100, B18=200, and N=19; the actual current gain will be 19.28. The circuit behaves essentially as a PNP transistor with a Beta of 19. Since this Beta is determined almost entirely by the geometry of transistor 15, it is not a function of temperature, current, supply voltage, or the IC processing variables that ordinarily determine transistor Beta. This supply independence is primarily due to the fact that the crucial current ratio in the collectors of transistor 15 is maintained over wide supply excursions. Both collector-base potentials are maintained at a constant value of approximately zero volts independent of supply voltage, thereby eliminating the Early Effect from the collector current ratio. Although the supply voltage will modulate the open loop current gain due to changes in B18 and B14, the net effect of this on closed loop gain is naturally very small because of the large amount of negative feedback.

FIG. 3 shows a higher gain version of the current gain cell of the invention. Transistor 15 is shown having a 19 to 1. Transistors 14, 15, and 18 are as shown in FIG. 2. Transistor 27 has its emitter-base circuit in parallel with that of transistor 18. Diode 28 couples the collector of transistor 27 to terminal 10. The emitter of transistor 27 is made to have twenty times the area of transistor 18 so that is must carry twenty times the current of transistor 18. Collector voltage dependent variations in $V_{BE}$ track because the collector of transistor 27 is one $V_{BE}$ below the potential of terminal 10 as is the collector of transistor 18. The 20 to 1 current ratio will be maintained at substantially all values of +V to −V potential. Thus, for FIG. 3, the current flowing out of terminal 11 will be the sum of $19 I_{IN} + (19 I_{IN} \times 20)$ or $399 I_{IN}$. A more accurate expression for the closed loop current gain is given by equation 2. The collector scaling of transistor 15 is represented by the variable, n, whereas the emitter scaling involving transistors 18 and 27 is represented by the variable, m.

$$\frac{I_{out}}{I_{in}} (m+1) n + \qquad (2)$$

-continued
$$\frac{n+1}{B15} \, 1 - \frac{1}{B14} \, \frac{n}{B18} + \frac{nm}{B27} + \frac{n}{B18} + \frac{nm}{B27}$$

For B18=B27=200 and B14=B15=100 and where n=19 and M=20, the closed loop gain is equal to 397. Thus, the circuit of FIG. 3 simulates an ideal PNP transistor with a high Beta determined almost entirely by geometrical ratios.

FIG. 4 illustrates a circuit that operates as the complement of FIGS. 2 and 3. Here the input $I_{IN}$ flows into terminal 30 from a current supply source (not shown). Transistor 25 is a dual collector device ratioed at 19 to 1 between collectors 23 and 24. Diode connected transistor 31 conducts the current from collector 24 and acts with transistor 32 as a current mirror, with respect to $I_{IN}$ flowing into terminal 30. Transistor 33 completes the feedback loop by having its base coupled to the collector of transistor 32 and its collector coupled to the base of transistor 25. Thus, transistors 25, 32, 31, and 33 comprise a three-stage common emitter amplifier with a fixed percentage of its output coupled to its input in negative feedback fashion and the respective emitters coupled between +V and −V as shown. As further shown, the current mirror transistors have an area ratio of 10 to 1 so that the current in collector 24 is 10 times the input current $I_{IN}$. Since the current from collector 23 flows between terminals 10 and 11 and is 19 times the current in collector 24, the overall gain from terminal 30 to terminal 10 is 200 times to provide a Beta of 200 as determined by area considerations. Thus, the circuit of FIG. 4 operates as an NPN transistor having a high Beta that is substantially independent of temperature, voltage, current, and IC fabrication variables that ordinarily affect current gain. It can be seen that for the larger Beta values, the currents flowing in the various transistor bases can be neglected without introducing serious error.

An examination of the circuit of FIG. 4 will show that it would be operative if collector 23 of transistor 25 were eliminated. However, the circuit current gain would be only eleven as determined by the current mirror device ratioing. Accordingly, even though the gain is low, the invention contemplates the configuration, where a single PNP transistor having a single collector is emitter coupled to the positive power supply terminal with three NPN transistors with their emitters coupled to the negative power supply terminal.

FIG. 5 illustrates the circuit of the invention employed in a two terminal photo current sensor. Dashed line 35 divides the circuit into a prior art photo sensor 36 and a current gain cell 37 which precisely and programmably multiplies photo current Ip.

The circuit designated at 36 is the basic photo detector of U.S. Pat. No. 4,118,621. For example, main photodiode 38 is made to have five times the area of bias photodiode 39. Transistor 40 is made to have five times the area of transistor 41. Thus, under illumination where photodiode 38 produces Ip, photodiode 39 will produce Ip/5. This ensures that transistors 40 and 41 operate at the same current density. Therefore, the potential across main photodiode 38 is zero. Thus, photodiode leakage at low light levels is substantially eliminated and Ip will be linearly related to illumination over at least six orders of magnitude.

The collector of transistor 40, which passes Ip, is coupled to the base of transistor 43 and the smaller collector 46 of dual collector transistor 44. Both transistors 43 and 44 are of lateral construction. Transistor 44 has a pair of collectors with collector 45 having an effective collection of 19 times that of collector 46. Since collector 45 is coupled to the base of transistor 44, the collector current of transistor 47 will be 19 Ip. Since essentially Ip flows in collector 46, the collector of transistor 43 will pass an Ip related current to the bases of transistors 47, 48, 52, 53, 54, and 55.

Transistors 43, 44 and 47 are coupled together in a high gain feedback loop. Due to the coupling of collector 45 to the base of transistor 44, it acts as a precision attenuator with a nineteen-to-one ratio. However, since transistors 43 and 47 operate in the common emitter configuration, the loop gain is very high. The three-stage loop configuration makes the feedback negative and will stabilize the operating point to satisfy the transistor geometry as determined by current ratioing. Thus, 20 Ip flows in the emitter of transistor 44 and 19 Ip flows in the collector of transistor 47.

Transistor 48 is made to have an area of five times that of transistor 47, thus causing it to mirror 95 Ip as shown. The collector of transistor 48 is coupled to terminal 10 by way of diode connected transistor 49. This ensures that the collector potential of transistor 48 will substantially track the collector potential of transistor 47 so that the area ratios alone determine the current mirror gain.

Programmable section 50 has been added to the basic current gain cell to permit gain adjustment by a trimming operation. Transistors 52-55 have binarily weighted emitter areas of 8A, 4A, 2A and A, respectively, and each emitter is coupled to a fusible link in the programmer shown as metallization 56.

The portrayal at 56 is to represent IC metallization in outline. Four wide areas are shown coupled to a wide strip by four narrow segments. The wide areas are each connected to a separate emitter of transistors 52-55 so that any one or any combination can be disconnected. This can be done by passing an excessive current through the narrowed portion of metallization by means of contact probes as is well known in the art. Alternatively, the narrow link portions can be selectively severed by laser beam, abrasive blast or other cutting means. With all links intact, transistors 52-55 will conduct a multiple of Ip to provide an output at terminal 11 of 400.2 Ip. With all of the narrow links severed, the total current at terminal 11 will be 115.2 Ip. Thus, by selectively severing one or more of the links, the output can be selected for intermediate output current gain values at increments of 19.

FIG. 6 shows how a plurality of current gain cells can be effectively cascaded to achieve very high current gain values. The input terminal 60 is coupled to gain cell 61 which is constructed in accordance with FIG. 4. The basic cell transistors 14', 18' and 25' produce a gain of 19X and current sink transistor 27' produces a gain of 20. Thus, cell 1 sources about 400 $I_{IN}$ out of terminal 11 and sinks 380 $I_{IN}$ to cell 62. Cell 62 of similar construction sinks about $144 \times 10^3$ $I_{IN}$ to cell 63 and cell 63 sinks about $54.9 \times 10^6$ $I_{IN}$ to the next stage. Additional cells can be added as desired. It is to be noted that each cell clamps the output of the preceding cell to a $V_{BE}$ below the potential of terminal 10. Thus, diode 28 of FIG. 4 is not needed in the cascade.

EXAMPLE

The circuit of FIG. 5 has been constructed in IC form using conventional fabrication techniques and is available under the commercial designation LM1892.

The photo sensor can be programmed to produce a terminal photo current of from 10 nA to 10 mA in full sunlight. The current was measured over six orders of magnitude of light intensity and was linear to within ±10% over the range with the major portion of the inaccuracy in the lowest decade where transistor Beta is least. The photo current is substantially independent of temperature and applied voltage from 1 V to 6 V The upper voltage limit is set by the breakdown of photodiode 39 and not by the current gain cell which by itself can take 60 V.

The invention has been described and a detailed application presented. Clearly there are alternatives and equivalents that will occur to a person skilled in the art upon reading the foregoing description. For example, since the amplifier gain is based in part upon a current mirror, the gain could be altered by the conventional use of resistors in the mirror. Also, the current gain could be programmed by making these resistors external to the IC package. In addition, the ratioing and hence, current gain can be changed by the application of fixed currents to various elements within the current gain cell. In this way, the photo sensor application can be made to display a light intensity threshold below which there is no response. Alternatively, the photo sensor can be make to produce a minimum output current at zero light input. These various modifications, as well as others, are within the spirit and intent of the invention. Accordingly, it is intended that the scope of the invention be limited only by the claims that follow.

We claim:

1. A current gain cell comprising:
   a first control current terminal;
   second and third controlled current terminals connectable to a source of potential;
   a three-stage common emitter amplifier having an output coupled to its input, two of said three-stages employing transistors complementary to the third-stage transistor, said three-stage common emitter amplifier including current attenuation means having an attenuation ratio that is small relative to the open loop current gain of said amplifier and an attenuation ratio dependent upon geometric configurations in said transistors;
   means for coupling said attenuation means to cause the attenuated current to flow in said first terminal;
   means for coupling the emitters of said two transistors to said second terminal;
   means for coupling the emitter of said third transistor to said third terminal, whereby the current flowing between said second and third terminals is proportional to the current flowing in said first terminal multiplied by said attenuation ratio and
   wherein one of said first and second transistors is a plural ratioed collector transistor with the larger of said collectors being coupled to its base and the smaller of said collectors being coupled to said first terminal, said collector ratio acting to determine said attenuation ratio.

2. The current gain cell of claim 1 further comprising a ratioed current mirror coupled to said third transistor to mirror the current therein as a multiple thereof so that said multiple flows between said second and third terminals, whereby the total current flowing between said second and third terminals is proportional to the current flowing in said first terminal multiplied by the product of said attenuation ratio and said current mirror ratio.

3. The current gain cell of claim 2 wherein said current mirror reflected current is coupled to drive a second current gain cell, whereby the cell gain values are cascaded.

4. The current gain cell of claim 2, wherein said current mirror includes means for programming the current ratio, whereby the current gain of said cell can be adjusted.

5. The current gain cell of claims 4, wherein said first terminal is coupled to a photodiode, whereby the current flowing between said second and third terminals is a light dependent current.

* * * * *